US009012958B2

(12) United States Patent
Inoue

(10) Patent No.: US 9,012,958 B2
(45) Date of Patent: Apr. 21, 2015

(54) SEMICONDUCTOR DEVICE

(71) Applicant: Sumitomo Electric Industries, Ltd., Osaka-shi, Osaka (JP)

(72) Inventor: Kazutaka Inoue, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 14/255,705

(22) Filed: Apr. 17, 2014

(65) Prior Publication Data
US 2014/0312357 A1 Oct. 23, 2014

(30) Foreign Application Priority Data

Apr. 18, 2013 (JP) ................................ 2013-087844

(51) Int. Cl.
*H01L 21/02* (2006.01)
*H01L 29/20* (2006.01)
*H01L 29/778* (2006.01)
*H01L 29/06* (2006.01)
*H01L 29/10* (2006.01)

(52) U.S. Cl.
CPC ........ *H01L 29/2003* (2013.01); *H01L 29/7786* (2013.01); *H01L 29/0607* (2013.01); *H01L 29/1058* (2013.01)

(58) Field of Classification Search
CPC .............. H01L 29/786; H01L 29/4236; H01L 29/4232; H01L 29/7785; H01L 29/7783; H01L 29/7848; H01L 29/76895; H01L 29/78681
USPC ............................ 257/183–195, 207, E29.068
See application file for complete search history.

(56) References Cited

U.S. PATENT DOCUMENTS

| 6,787,820 | B2 * | 9/2004 | Inoue et al. ................... 257/192 |
| 7,622,398 | B2 * | 11/2009 | Udagawa ...................... 438/778 |
| 7,714,360 | B2 * | 5/2010 | Otsuka et al. ................. 257/194 |
| 8,525,225 | B2 * | 9/2013 | Kambayashi et al. ........ 257/192 |
| 2009/0045438 | A1 * | 2/2009 | Inoue et al. ................... 257/192 |
| 2009/0267081 | A1 * | 10/2009 | Udagawa ........................ 257/77 |
| 2011/0006346 | A1 * | 1/2011 | Ando et al. ................... 257/192 |
| 2013/0105811 | A1 * | 5/2013 | Ando et al. ..................... 257/76 |
| 2013/0264657 | A1 * | 10/2013 | Komatani et al. ............. 257/402 |
| 2014/0179078 | A1 * | 6/2014 | Komatani ..................... 438/285 |
| 2014/0239311 | A1 * | 8/2014 | Kawai et al. .................... 257/76 |

FOREIGN PATENT DOCUMENTS

JP 2008-306025 12/2008

* cited by examiner

*Primary Examiner* — Michael Lebentritt
(74) *Attorney, Agent, or Firm* — Smith, Gambrell & Russell LLP

(57) ABSTRACT

A semiconductor device of the invention includes an n-GaN layer provided on a substrate, a channel layer provided in contact with the upper surface of the n-GaN layer, an electron supply layer which is provided on the channel layer, and a gate electrode, a source electrode, and a drain electrode which are provided on the electron supply layer. The gate electrode is in contact with an underlying layer made from a nitride semiconductor. The semiconductor device has a ratio defined by the equation $L/d1 \geq 7$, where L is the width of the gate electrode in contact with the underlying layer in a direction between the source electrode and drain electrode; and d1 is the distance between a surface of the n-type gallium nitride layer and a boundary between the gate electrode and the underlying layer.

12 Claims, 10 Drawing Sheets

# SEMICONDUCTOR DEVICE

BACKGROUND OF THE INVENTION

1. Field of the Invention

The present invention relates to a semiconductor device.

2. Related Background Art

A semiconductor device using a nitride semiconductor such as a High Electron Mobility Transistor (HEMT) and the like is sometimes used as a high-frequency output amplification element. The HEMT is required to have high output and high linearity. Two-dimensional electron gas (2DEG) with high concentration occurs in the vicinity of an interface between a channel layer and an electron supply layer of a HEMT using gallium nitride (GaN). A semiconductor device including the channel layer formed by GaN is disclosed in Japanese Unexamined Patent Application Publication No. 2008-306025.

SUMMARY

Distortion such as inter-modulation distortion and the like sometimes occurs in a high-frequency device such as the HEMT. Moreover, in order to obtain high output, it is required to suppress a leakage current. However, it has been difficult to suppress both the inter-modulation distortion and the leakage current together. The invention is made in view of the above-mentioned problems, and aims to provide a semiconductor device which can ensure high linearity and suppress a leakage current.

A semiconductor device according to an embodiment of the invention includes a nitride semiconductor layer provided on a substrate, an n-type gallium nitride layer provided on the nitride semiconductor layer, a channel layer which is provided in contact with the upper surface of the n-type gallium nitride layer and is made from a nitride semiconductor, an electron supply layer which is formed of a nitride semiconductor and is provided on the channel layer, and a gate electrode, a source electrode, and a drain electrode which are provided on the electron supply layer. When setting a width of a contact surface between the gate electrode and the ground layer of the gate electrode in a gate length direction to L and a distance between a surface of the n-type gallium nitride layer and the contact surface to d1, L/d1 is 7 or more.

According to the present invention, it is possible to provide a semiconductor device which can ensure high linearity and suppress a leakage current.

DESCRIPTION OF THE PREFERRED EMBODIMENTS

Description of Embodiments of the Invention

First, the contents of embodiments of the invention will be listed and described. A semiconductor device according to an embodiment of the invention includes an n-type gallium nitride layer provided (for example, formed) on the nitride semiconductor layer, a channel layer which is provided (for example, formed) in contact with the upper surface of the n-type gallium nitride layer and is made from a nitride semiconductor, an electron supply layer which is provided on the channel layer and is made from a nitride semiconductor, and a gate electrode, a source electrode, and a drain electrode which are provided on the electron supply layer, and the gate electrode is in contact with an underlying layer made from a nitride semiconductor, and the semiconductor device has a ratio defined by the following equation: $L/d1 \geq 7$, where: L is the width of the gate electrode in contact with the underlying layer in a direction between the source electrode and drain electrode; d1 is the distance between a surface of the n-type gallium nitride layer and a boundary between the gate electrode and the underlying layer.

In the embodiment, the product of a dopant concentration of the n-type gallium nitride layer and a thickness of the n-type gallium nitride layer may be $1.4 \times 10^{12}$ cm$^{-2}$ to $0.9 \times 10^{12}$ cm$^{-2}$.

In the embodiment, a dopant concentration of the n-type gallium nitride layer may be $3.0 \times 10^{18}$ cm$^{-3}$ or less, In the embodiment, a thickness of the n-type gallium nitride layer may be 40 nm or less.

In the embodiment, a thickness of the channel layer may be 3 nm to 20 nm.

In the embodiment, the n-type gallium nitride layer is provided on a nitride semiconductor layer and a thickness of the nitride semiconductor layer may to 100 nm to 3 μm.

In the embodiment, the semiconductor device may further include a cap layer which is made of a nitride semiconductor and in contact with the upper surface of the electron supply layer, and the gate electrode may be in contact with the upper surface of the cap layer.

In the embodiment, the electron supply layer may be formed of aluminum gallium nitride, indium aluminum nitride or indium aluminum gallium nitride.

In the configuration, the L/d1 may be 10 or more.

DETAILED DESCRIPTION OF THE EMBODIMENT OF THE INVENTION

The embodiment of the invention will be described in detail using drawings.

Figure 1A:
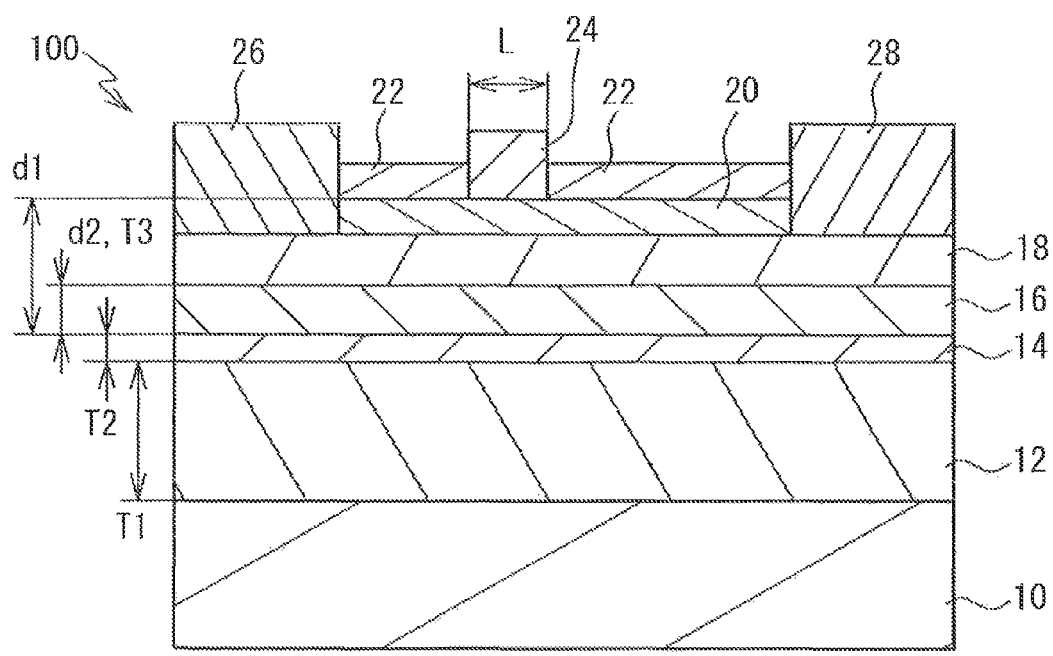
FIG. 1A is a cross-sectional view which illustrates a semiconductor device according to Example 1.

FIG. 1A is a cross-sectional view which illustrates a semiconductor device 100 according to an embodiment of the invention. The semiconductor device 100 is a HEMT which amplifies a high-frequency signal of a microwave bandwidth whose frequency is, for example, 300 MHz to 100 GHz.

As shown in FIG. 1A, a buffer layer 12 as a nitride semiconductor layer of the embodiment is provided (for example, formed) on a substrate 10, and an n-GaN layer 14 is provided on the buffer layer 12. A channel layer 16 as an electron transit layer of the embodiment is provided on the n-GaN layer 14, and an electron supply layer 18 is provided on the channel layer 16. A cap layer 20 is provided on the electron supply layer 18, and an insulating layer 22 is provided on the cap layer 20. A gate electrode 24 is provided on the upper surface of the cap layer 20 which is exposed from the opening of the insulating layer 22. Recesses are formed on the cap layer 20, and a source electrode 26 and a drain electrode 28 are provided on the upper surface of the electron supply layer 18 which is exposed from the recesses. The n-GaN layer 14 comes in contact with the upper surface of the buffer layer 12, and the channel layer 16 comes in contact with the upper surface of the n-GaN layer 14. 2DEG (two-dimensional electron gas) is formed in a region of an approximately 10 nm depth to the channel layer 16 side from an interface between the channel layer 16 and the electron supply layer 18.

The substrate 10 is formed of a material such as silicon carbide (SIC), silicon (Si), sapphire, or the like. The buffer layer 12, the n-GaN layer 14, the channel layer 16, the electron supply layer 18, and the cap layer 20 are epitaxially grown nitride semiconductor layers. The buffer layer 12 and the channel layer 16 are formed of non-doped gallium nitride (i-GaN). The n-GaN layer 14 and the cap layer 20 are formed of n-GaN including Si as a dopant. The thickness of the buffer layer 12 is set to T1, the thickness of the n-GaN layer 14 is set to 12, and the thickness of the channel layer 16 is set to T3. The electron supply layer 18 is formed of, for example, aluminum gallium nitride (AlGaN). The insulating layer 22 is formed of an insulator such as silicon nitride (SiN) and the like. The source electrode 26 and the drain electrode 28 are ohmic electrodes formed by laminating metals such as titanium and aluminum (Ti/Al), tantalum and aluminum (Ta/Al), or the like successively from the nearest position to the electron supply layer 18. The gate electrode 24 is formed, for example, by laminating metals such as nickel and aluminum (Ni/Al) or the like successively from the nearest position to the cap layer 20.

Figure 1B:
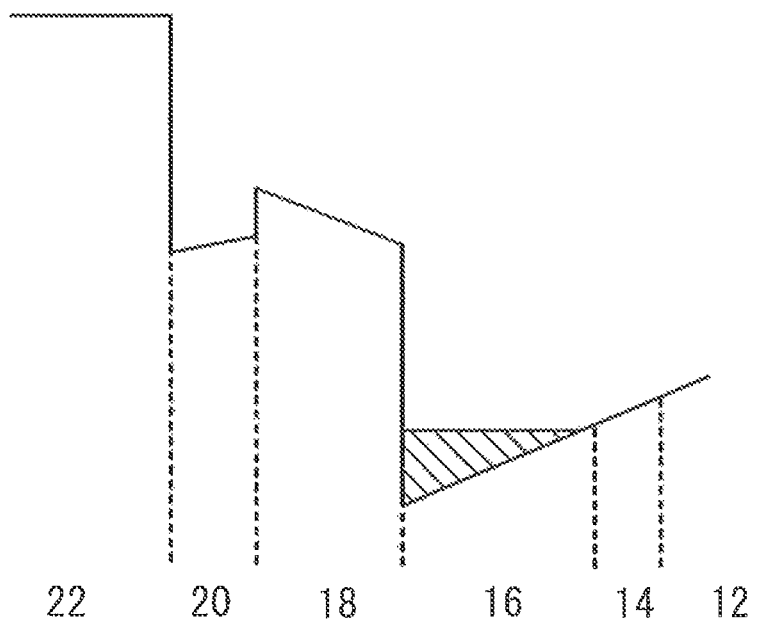
FIG. 1B is a schematic view which illustrates a band structure of the semiconductor device.

FIG. 1B is a schematic view which illustrates a band structure of the semiconductor device 100, and shows a band of the insulating layer 22, the cap layer 20, the electron supply layer 18, the channel layer 16, the n-GaN layer 14, and the buffer layer 12 successively from the left. The shaded region in FIG. 1B represents 2DEG. The n-GaN layer 14 is inserted between the channel layer 16 and the buffer layer 12, and thereby the band shape becomes gentle from the channel layer 16 to the buffer layer 12 compared to a band shape in a comparative example to be described below.

Figure 2A:
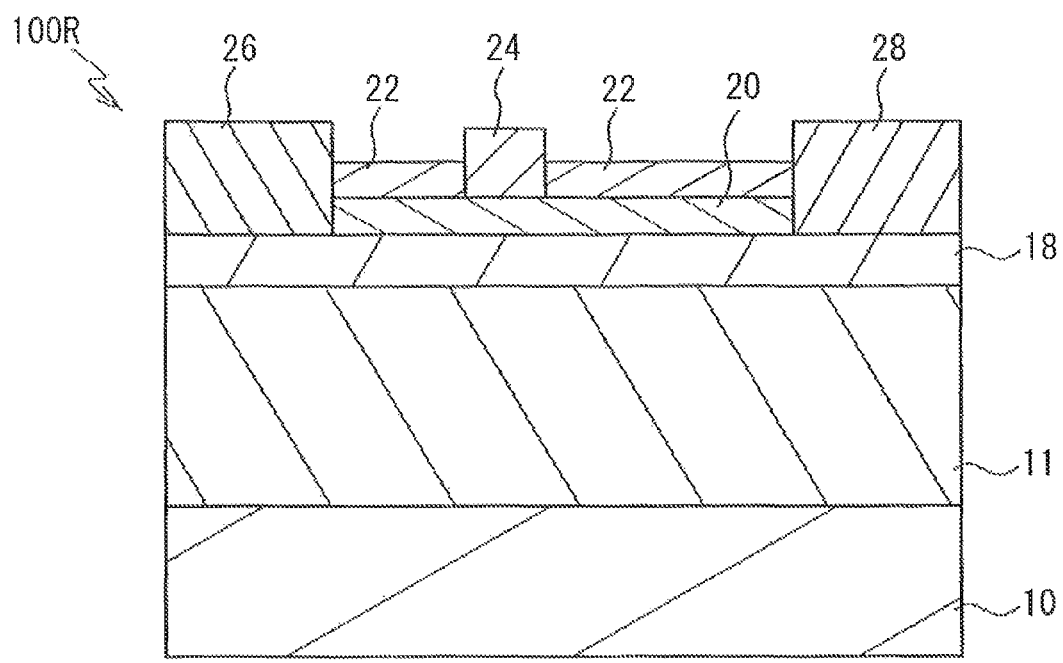
FIG. 2A is a cross-sectional view which illustrates a semiconductor device according to a comparative example.
Figure 2B:
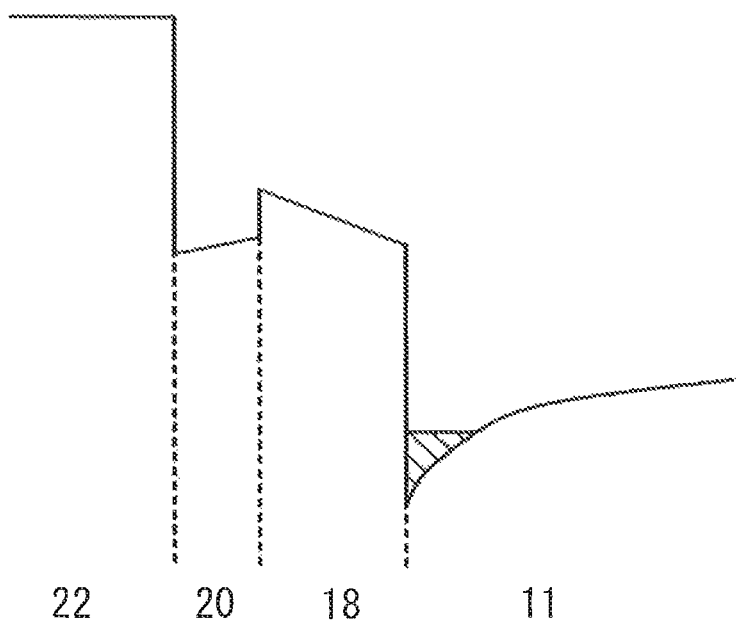
FIG. 2B is a schematic view which illustrates a band structure of the semiconductor device.

FIG. 2A is a cross-sectional view which illustrates a semiconductor device 100R according to a comparative example to the embodiment. As shown in FIG. 2A, the n-GaN layer 14 is not provided. A i-GaN layer 11 which functions as a buffer layer and a channel layer is provided on the upper surface of the substrate 10, and the electron supply layer 18 is provided on the i-GaN layer 11. Other configurations of the semiconductor device 100S according to the comparative example are the same as the configuration of the semiconductor device 100 according to the embodiment. FIG. 2B is a schematic view which illustrates a band structure of the semiconductor device 100R. As shown in FIG. 2B, the band of the i-GaN layer 11 rises steeply compared to the band from the channel layer 16 to the buffer layer 12 of the embodiment shown in FIG. 1B. The steep band structure is made by the polarization charge of i-GaN.

It is important to obtain high linearity in a HEMT. High-order components of conductance influence linearity. When series-expanding a drain current Ids using a voltage Vg between a gate and a source, Ids is represented by following Formula 1.

$$Ids = gm1 \times Vg + gm2 \times Vg^2/2! + gm3 \times Vg^3/3! + gm4 \times Vg^4/4! + \quad \text{Formula 1}$$

gm1 is a basic component of the conductance, and gm2, gm3, gm4 and so forth are high-order components of the conductance. Tertiary inter-modulation distortion IMD3 is represented by following Formula 2 using gm1 and gm3. A is an integer, and Vs is a voltage between a source and a drain.

$$IMD3 = 20 \log(A \times Vs^2 \times (gm3/gm1)) \quad \text{Formula 2}$$

When gm3 is large, the tertiary inter-modulation distortion IMD3 is increased, thereby deteriorating the linearity. By decreasing gm3, the IMD3 is suppressed and it is possible to obtain high linearity. In the following, it is described that high linearity is obtained in the embodiment when contrasting Example 1 of the embodiment with the comparative example.

In Example 1 and the comparative example, the Ids–Vg characteristics and the gm–Vg characteristics are respectively measured. Sizes and compositions of the semiconductor device 100 of Example 1 used in the measurement are as follows.

Material of substrate 10: SiC
Thickness T1 of the buffer layer 12 (GaN): 930 nm
Thickness T2 of the n-GaN layer 14: 20 nm
Thickness T3 of the channel layer 16 (GaN): 50 nm
Thickness of the electron supply layer 18 (AlGaN): 24 nm
Composition of the electron supply layer 18:
a dopant (Si) is included, and an Al composition ratio is 23%.
Thickness of the cap layer 20 (GaN): 5 nm
Si dopant concentration of the n-GaN layer 14, the electron supply layer 18, and the cap layer 20:
$1.5 \times 10^{18}$ cm$^{-3}$
Length L of the gate electrode 24: 1 µm
The thickness of the i-GaN layer 11 of the semiconductor device 100R in the comparative example is 960 nm. Other sizes and compositions of the semiconductor device 100R in the comparative example are the same as the size and the composition of the semiconductor device 100 in Example 1.

Figure 3A:
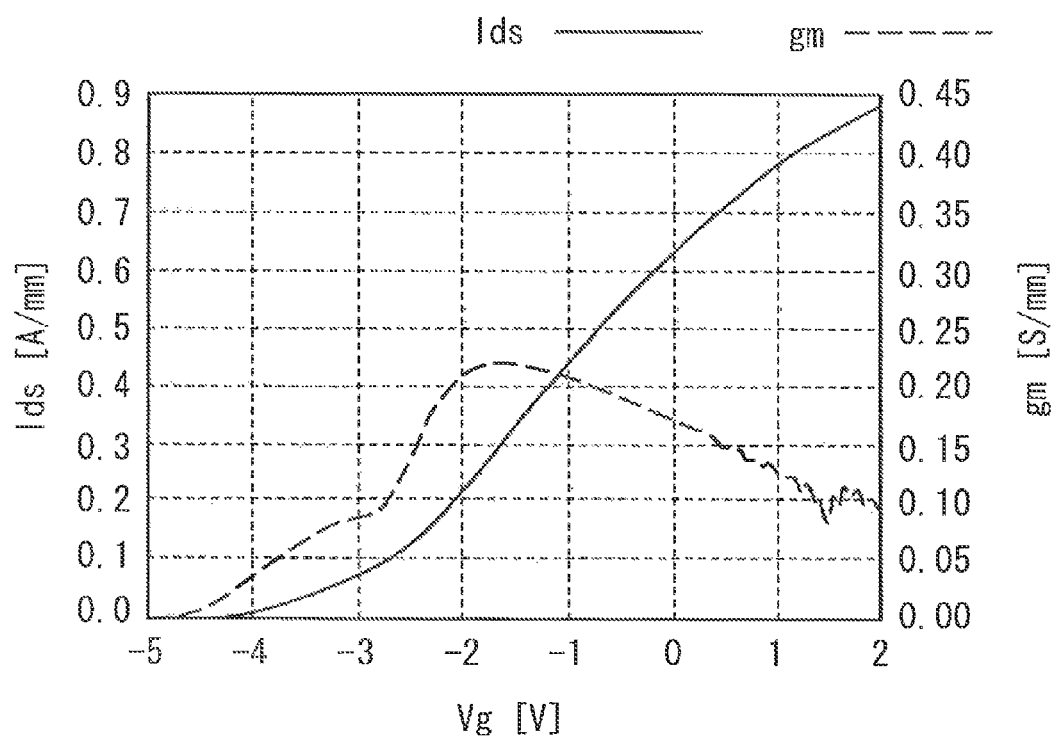
FIG. 3A is a diagram which shows a result of measuring Ids–Vg characteristics and gm–Vg characteristics in Example 1.

FIG. 3A is a diagram which shows a result of measuring the Ids–Vg characteristics and the gm–Vg characteristics in Example 1. In FIG. 3A, a horizontal axis shows a gate voltage Vg, and a left vertical axis and a solid line show a drain current ids. A right vertical axis and a dashed line show conductance gm.

As shown in FIG. 3A, gm increases slowly from the vicinity of Vg=−4 V in Example 1. In addition, the drain current Ids slowly rises. Accordingly, gm3 is decreased as described below in FIG. 4A, and a tertiary inter-modulation distortion IMD3 of a drain current shown in Formula 2 is reduced.

Figure 3B:
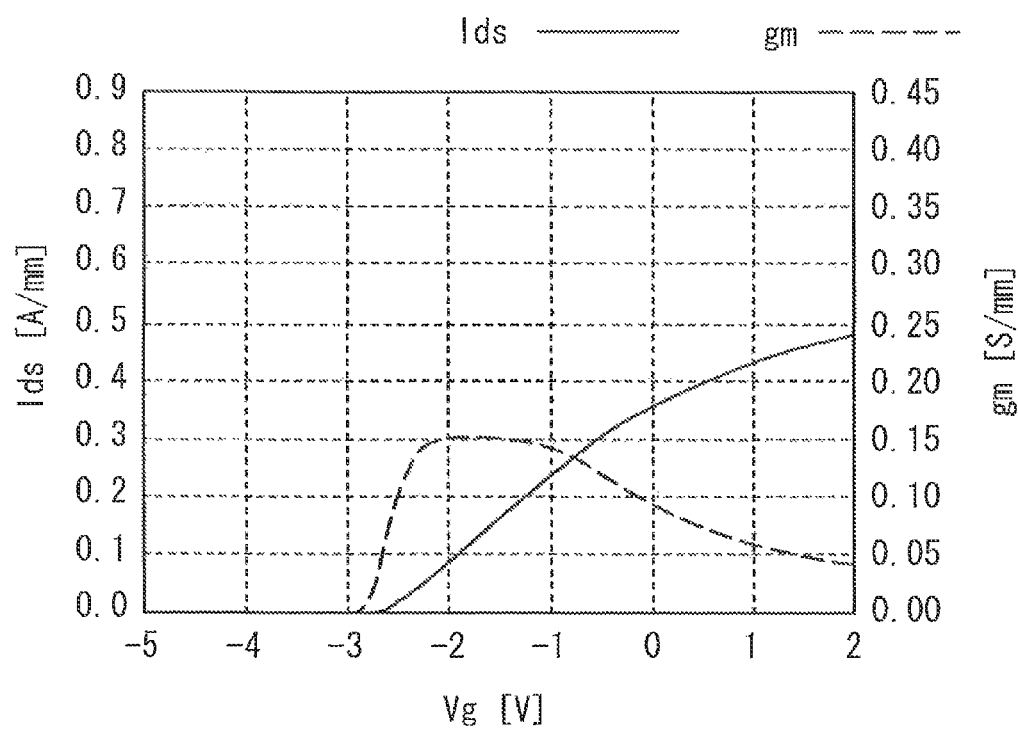
FIG. 3B is a diagram which shows a result of measuring the Ids–Vg characteristics and the gm–Vg characteristics in a comparative example.
Figure 4A:
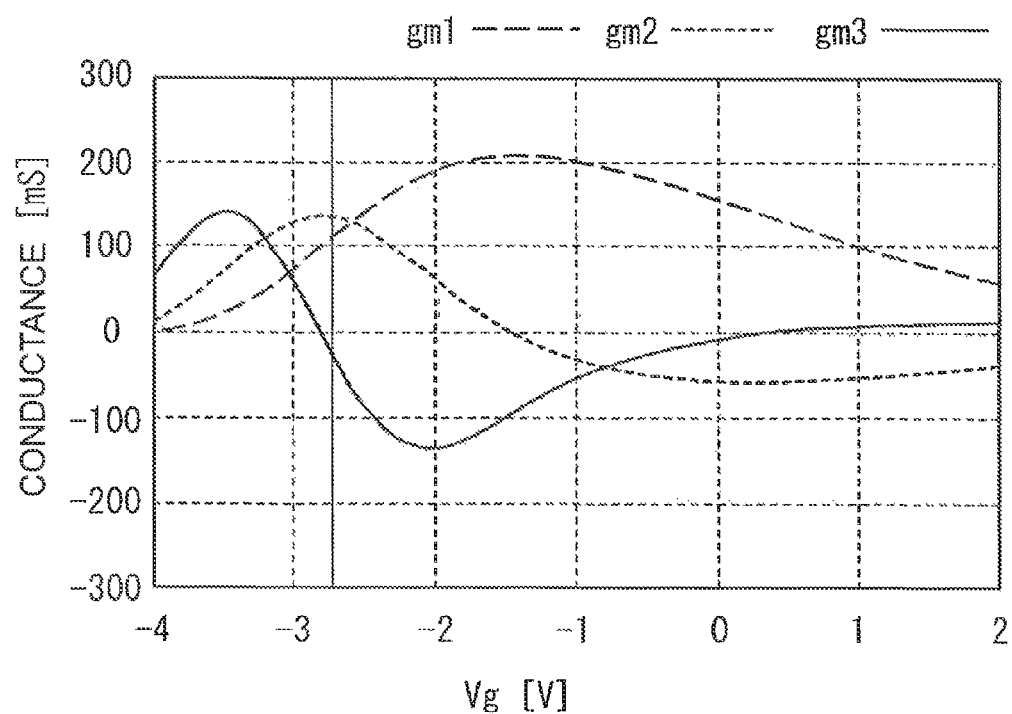
FIG. 4A is a diagram which shows a result of calculating gm1, gm2, and gm3 in Example 1.
Figure 4B:
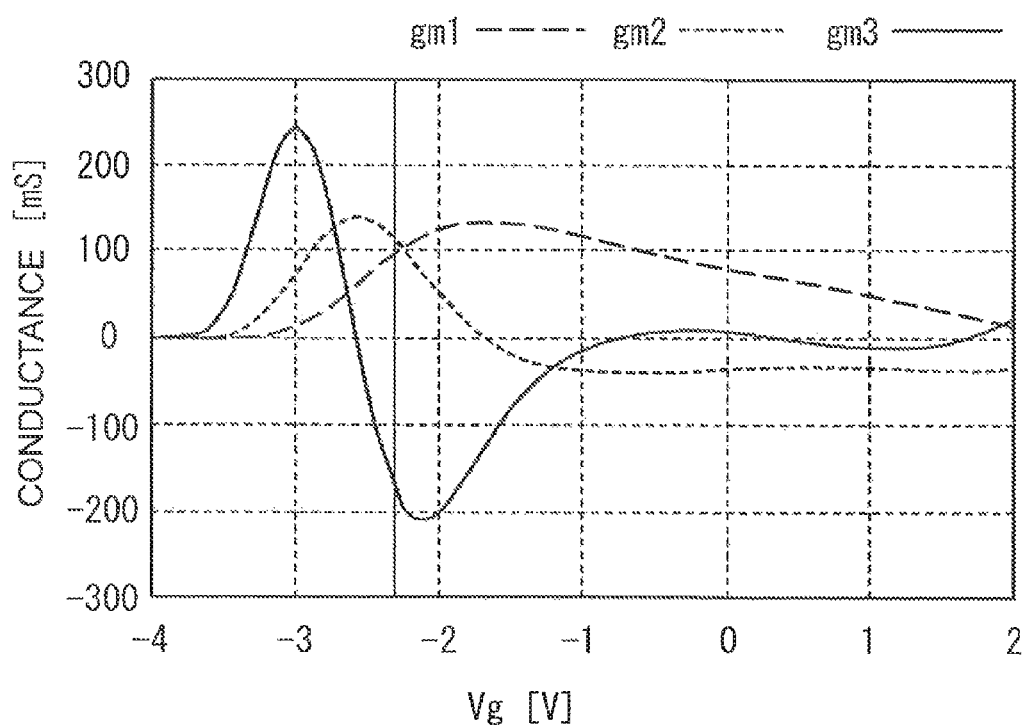
FIG. 4B is a diagram which shows a result of calculating gm1, gm2, and gm3 in the comparative example.

FIG. 3B is a diagram which shows a result of measuring the Ids–Vg characteristics and the gm–Vg characteristics in the comparative example. As shown in FIG. 3B, gm increases rapidly from an area where Vg exceeds −3 V. Moreover, the drain current Ids rapidly rises. Accordingly, gm3 is increased as described below in FIG. 4B, so that the inter-modulation distortion IMD3 of the drain current is increased.

gm1, gm2, and gm3 are calculated by series-expanding the Ids as shown in Formula 1. FIG. 4A is a diagram which shows a result of calculating gm1, gm2, and gm3 in Example 1. FIG. 4B is a diagram which shows a result of calculating the gm1, gm2, and gm3 in the comparative example. In FIGS. 4A and 4B, a horizontal axis shows a gate voltage Vg, and a vertical axis shows conductance, a dashed line represents a primary component gm1, a dotted line represents a secondary component gm2, and a solid line represents a tertiary component gm3.

As shown in a solid line of the vertical axis direction (a solid line parallel to the vertical axis) in FIG. 4A, an operation point in Example 1 is approximately −2.8 V, gm3 in the vicinity of the operation point is approximately −40 mS. As shown in FIG. 4B, an operation point in the comparative example is approximately −2.4 V. gm3 in the vicinity of the operation point is approximately −200 mS. In the comparative example, the band structure of the i-GaN layer 11 is steep as shown in FIG. 2B, and thereby gm3 is increased. According to Example 1, the band structure from the channel layer 16 to the buffer layer 12 in Example 1 is more gentle than a band structure in the comparative example as shown in FIG. 1B, and thereby it is possible to reduce gm3 at the operation point to approximately 15 compared to in Comparative Example 1.

Figure 5:
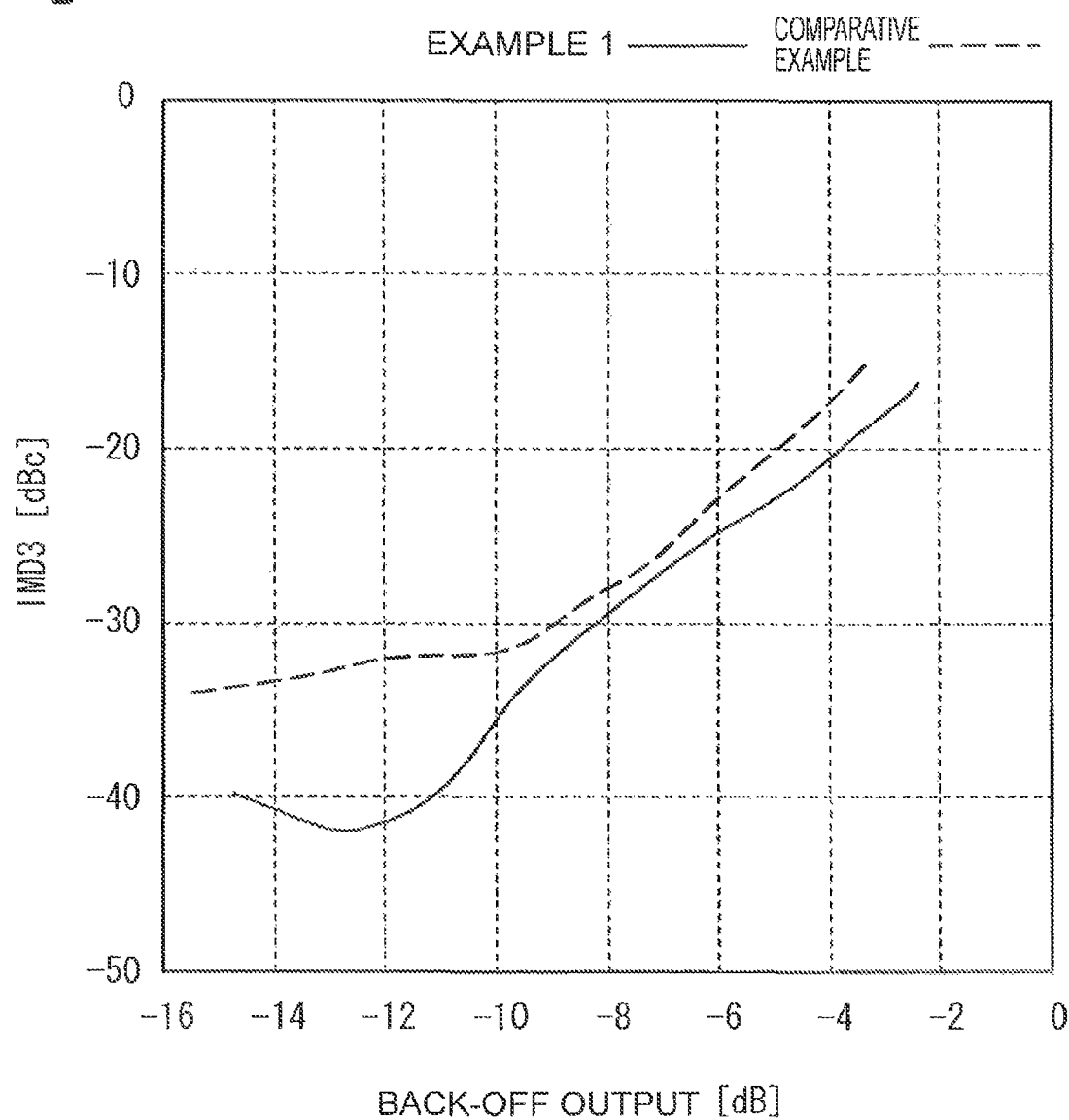
FIG. 5 is a diagram which shows a result of measuring IMD3.

FIG. 5 is a diagram which shows a result of measuring IMD3. A vertical axis represents IMD3. A horizontal axis represents back-off output. A solid line represents measurement result in Example 1, and a dashed line represents the measurement result in the comparative example. The magnitude of the drain current is set to 10% of a saturated current Ifmax. Frequencies of a signal are 8 GHz and 8.01 GHz.

As shown in FIG. 5, according to Example 1, IMD3 is lowered compared to IMD3 in the comparative example. According to Example 1, IMD3 is greatly reduced particularly when back-off output is −9 dB or less, and is minimized when back-off output is about −13 dB. As described above, according to the embodiment, the n-GaN layer 14 is provided between the buffer layer 12 and the channel layer 16, and thereby the band becomes gentle. gm3 is lowered by the gentle band and the IMD3 is decreased.

When the n-GaN layer 14 is provided, the band shape becomes gentle as shown in FIG. 1B, so that there is a possibility that a leakage current becomes large. As shown in FIG. 1A, a distance d1 between the n-GaN layer 14 and the gate electrode 24 becomes large, so that a leak path is formed at a position spaced away from 2DEG (the n-GaN layer 14, the buffer layer 12, and the like), and the leakage current is increased. In order to suppress the leakage current, it is preferable to decrease the distance d1. The distance d1 is the shortest distance from the surface of the n-GaN layer 14 to the bottom surface of the gate electrode 24, and the bottom surface of the gate electrode 24 is a contact surface between the gate electrode 24 and the ground layer of the gate electrode 24. The magnitude of the leakage current is changed by a ratio (aspect ratio) L/d1 of the distance d1 to the length L of the gate electrode. The length L refers to the width of the bottom surface of the gate electrode 24 in a gate length direction (namely in a direction between the source electrode 26 and drain electrode 28), which comes in Schottky contact with the cap layer 20.

By changing the aspect ratio in the semiconductor device 100 according to a plurality of examples corresponding to the embodiment, the leakage current (leakage current when the semiconductor device 100 is in a pinch-off state) is measured. In the plurality of examples, the thickness of the buffer layer 12 is set to 960 nm. By changing the length L of the gate electrode 24 in the plurality of examples, the aspect ratio L/d1 is changed. Other conditions are the same as conditions used for the measurement in Example 1 of FIG. 3A. The gate voltage Vg is set to −5 V, and the drain voltage is set to 10 V.

Figure 6:
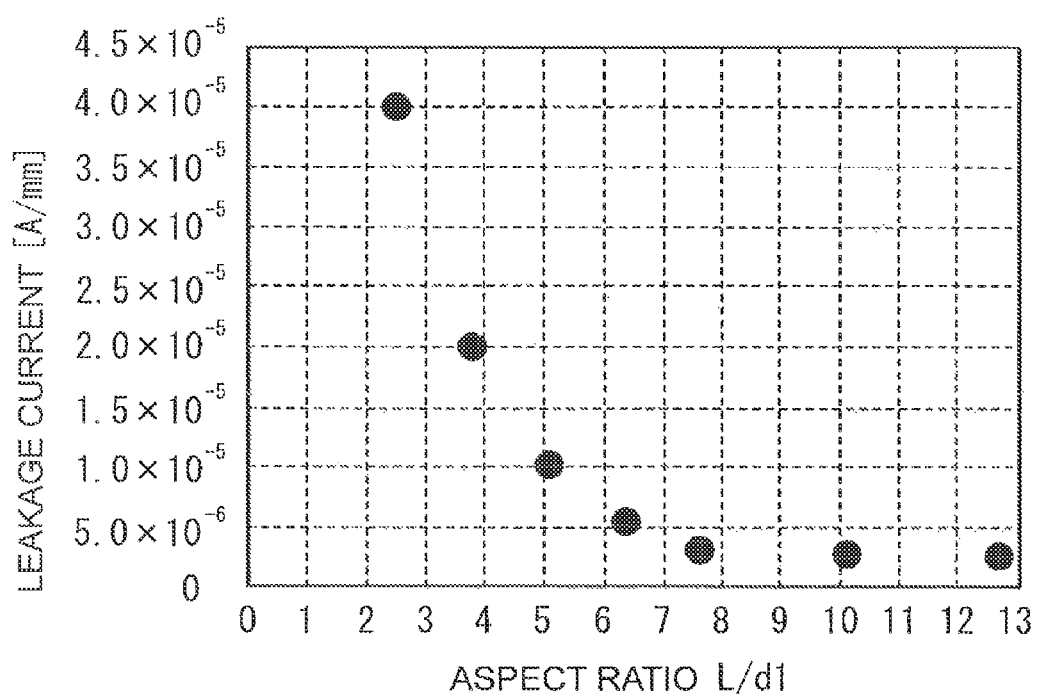
FIG. 6 is a diagram which shows a result of measuring a leakage current.

FIG. 6 is a diagram which shows a result of measuring a leakage current in the plurality of examples. The horizontal axis of FIG. 6 represents the aspect ratio, and the vertical axis represents a leakage current. As shown in FIG. 6, when the aspect ratio is equal to or more than 7, the leakage current is equal to or less than $5.0 \times 10^{-6}$ A/mm. By setting the aspect ratio to 7 or more, it is possible to suppress the leakage current and to obtain high linearity. By the suppression of the leakage current, efficiency of the semiconductor device 100 can be improved, and thermal runaway can be suppressed. In Example 1, L is set to 1 μm, d1 is set to 0.079 and the aspect ratio is set to 12.6 (=1/0.079). The aspect ratio may be set to 13 or more. In order to suppress the leakage current, it is preferable to set the aspect ratio to 10 or more. Further, the aspect ratio may be set to, for example, 6 or more, 8 or more, 9 or more, 20 or less, 15 or less, and the like. In addition, when the aspect ratio is 7 or more, it is possible to form the gate electrode 24 with good reproducibility. This is caused by the fact that it is possible to obtain a wide margin in the formation of the length L of the gate electrode 24 since the gate electrode 24 is formed by a photolithography technology.

Since a change in the band shape influences 2DEG more as a distance d2 (equivalent to a thickness T3 of the channel layer 16) between the electron supply layer 18 and the n-GaN layer 14 shown in FIG. 1A gets smaller, IMD3 can be effectively reduced. The aspect ratio L/d1 is increased since the distance d1 is also decreased when the distance d2 is decreased. When the aspect ratio is increased, the leakage current is also suppressed as shown in FIG. 6. For high linearity and the suppression of a leakage current, the distance d2 is preferably, for example, 20 nm or less. When the distance d2 is decreased, the n-GaN layer 14 and 2DEG overlap each other, and an electron mobility is lowered by impurities in the n-GaN layer 14. In order to suppress the lowering of the electron mobility, the distance d2 is preferably 5 nm or more. It is possible to set the distance d2 (thickness T3) to, for example, 3 nm or more, 8 nm or more, 10 nm or more, 18 nm or less, and 15 nm or less. When a dopant concentration of the n-GaN layer 14 is small, the distance d2 (thickness T3) may be 40 nm or less.

Sizes and compositions are changeable. Table 1 is a table which shows sizes and compositions in Example 1, and Modification Examples 1 to 4 of Example 1. From the left, a thickness T1 of the buffer layer 12, a thickness T2 of the n-GaN layer 14, a thickness T3 of the channel layer 16, and a dopant concentration of the n-GaN layer 14 are displayed.

TABLE 1

| | T1 [nm] | T2 [nm] | T3 [nm] | Dopant concentration [cm$^{-3}$] | Product [cm$^{-2}$] | IMD3 suppression effects |
|---|---|---|---|---|---|---|
| Example 1 | 930 | 20 | 50 | $1.5 \times 10^{18}$ | $3.0 \times 10^{12}$ | Large |
| Modification Example 1 | 930 | 20 | 50 | $0.7 \times 10^{18}$ | $1.4 \times 10^{12}$ | Small |
| Modification Example 2 | 960 | 20 | 20 | $0.7 \times 10^{18}$ | $1.4 \times 10^{12}$ | Small |
| Modification Example 3 | 930 | 40 | 50 | $0.7 \times 10^{18}$ | $2.8 \times 10^{12}$ | Large |
| Modification Example 4 | 960 | 20 | 20 | $1.5 \times 10^{18}$ | $3.0 \times 10^{12}$ | Medium |

According to Modification Examples 1 and 2, it is possible to reduce a tertiary inter-modulation distortion IMD3. However, the effect of the reduction is less than that in Example 1. This is because the dopant concentration is small. According to Modification Example 3, it is possible to reduce the tertiary inter-modulation distortion IMD3 to the same extent as in Example 1. Since the dopant concentration of Modification Example 3 is half that of Example 1 or less, but the thickness T2 of the n-GaN layer 14 is twice as much, an effect at the same level as in Example 1 can be obtained. According to Modification Example 4, it is possible to reduce the tertiary inter-modulation distortion IMD3.

In order to reduce the IMD3 by obtaining the band structure as shown in FIG. 1B, it is preferable that the product of the dopant concentration of the n-GaN layer 14 and the thickness of the n-GaN layer 14 be $3.0\times10^{12}$ cm$^{-2}$ or more. For example, the product may be $4.0\times10^{12}$ cm$^{-2}$ or more, $3.5\times10^{12}$ cm$^{-2}$ or more, $2.5\times10^{12}$ cm$^{-2}$ or more, and $2.0\times10^{12}$ cm$^{-2}$ or more. When considering an upper limit of doping concentration for the n-GaN layer 14, the product of the dopant concentration and the thickness of the n-GaN layer 14 is preferably $9.0\times10^{12}$ cm$^{-2}$ or less. In addition, when considering the lowering of the IMD3 and an upper limit of doping concentration, the product of the dopant concentration of the n-GaN layer 14 and the thickness of the n-GaN layer 14 is preferably $3.0\times10^{12}$ cm$^{-2}$ to $5.0\times10^{12}$ cm$^{-2}$. Moreover, as shown in Modification Examples 1 and 2, the IMD3 can be reduced even when the product of the dopant concentration of the n-GaN layer 14 and the thickness of the n-GaN layer 14 is around $1.4\times10^{12}$ cm$^{-2}$.

In order to grow the n-GaN layer 14 having good crystallinity, the dopant concentration of the n-GaN layer 14 is preferably $3.0\times10^{18}$ cm$^{-3}$ or less. The dopant concentration of the n-GaN layer 14 may be set to, for example, $4.0\times10^{18}$ cm$^{-3}$ or less, $3.5\times10^{18}$ cm$^{-3}$ or less, $2.5\times10^{18}$ cm$^{-3}$ or less, and $2.0\times10^{18}$ cm$^{-3}$ or less. In order to make the band structure gentle, the dopant concentration of the n-GaN layer 14 is preferably, for example, $0.5\times10^{18}$ cm$^{-3}$ or more, and is more preferably $1.0\times10^{18}$ cm$^{-3}$ or more. In order to suppress a short channel effect, the thickness T2 of the n-GaN layer 14 is preferably 40 nm or less, and may be set to, for example, 50 nm or less, and 30 nm or less.

The thickness T3 (equivalent to the distance d2 of FIG. 1A) of the channel layer 16 can be set to 5 nm to 40 nm as described above, and preferably to 5 nm to 20 nm. Accordingly, high linearity can be ensured and a leakage current can be suppressed. The thickness T1 of the buffer layer 12 is preferably 100 nm to 3 μm. This is because the n-GaN layer 14 and the channel layer 16 have high crystallinity, and high mass-productivity is obtained. The thickness T1 may be set to, for example, 150 nm or more, 200 nm or more, 3.5 μm or less, 4.0 μm or less, and the like. For example, an aluminum nitride (AlN) layer or an AlGaN layer may be provided between the buffer layer 12 and the substrate 10. Recess may not be formed on the cap layer 20, and the source electrode 26 and the drain electrode 28 may be provided on the upper surface of the cap layer 20.

A nitride semiconductor besides a material described with regard to FIG. 1A may be used as a material configuring the electron supply layer 18 and the cap layer. The nitride semiconductor is a semiconductor containing nitrogen, and includes, for example, AlN, indium nitride (InN), indium gallium nitride (InGaN), indium aluminum nitride (InAlN), aluminum indium gallium nitride (AlInGaN), and the like.

As described above, embodiments and examples of the invention are described, but the invention is not limited to the specific embodiments and examples. Within the scope of a gist of the invention described in the scope of claims, various modifications and changes can be made.

What is claimed is:

1. A semiconductor device comprising:
n-type gallium nitride layer provided on a substrate;
a channel layer which is provided in contact with the upper surface of the n-type gallium nitride layer and is made from a nitride semiconductor;
an electron supply layer which is provided on the channel layer and is made from a nitride semiconductor; and
a gate electrode, a source electrode, and a drain electrode which are provided on the electron supply layer,
wherein the gate electrode is in contact with an underlying layer made from a nitride semiconductor, and the semiconductor device has a ratio defined by the following equation:

$$L/d1 \geq 7$$

where:
L is the width of the gate electrode in contact with the underlying layer in a direction between the source electrode and drain electrode; and
d1 is the distance between a surface of the n-type gallium nitride layer and a boundary between the gate electrode and the underlying layer.

2. The semiconductor device according to claim 1, wherein the product of a dopant concentration of the n-type gallium nitride layer and a thickness of the n-type gallium nitride layer is $1.4\times10^{12}$ cm$^{-2}$ to $9.0\times10^{12}$ cm$^{-2}$.

3. The semiconductor device according to claim 1, wherein a dopant concentration of the n-type gallium nitride layer is $3.0\times10^{18}$ cm$^{-3}$ or less.

4. The semiconductor device according to claim 1, wherein a thickness of the n-type gallium nitride layer is 40 nm or less.

5. The semiconductor device according to claim 1, wherein a thickness of the channel layer is 3 nm to 20 nm.

6. The semiconductor device according to claim 1, wherein the n-type gallium nitride layer is provided on a nitride semiconductor layer and a thickness of the nitride semiconductor layer is 100 nm to 3 μm.

7. The semiconductor device according to claim 1, wherein the underlying layer is a cap layer which is in contact with the upper surface of the electron supply layer, and
wherein the gate electrode is in contact with the upper surface of the cap layer.

8. The semiconductor device according to claim 1, wherein the electron supply layer is formed of aluminum gallium nitride, indium aluminum nitride or indium aluminum gallium nitride.

9. The semiconductor device according to claim 1, wherein L/d1 is 10 or more.

10. The semiconductor device according to claim 1, wherein the n-type gallium nitride layer includes silicon.

11. The semiconductor device according to claim 2, wherein the n-type gallium nitride layer includes silicon.

12. The semiconductor device according to claim 3, wherein the n-type gallium nitride layer includes silicon.

* * * * *